United States Patent [19]

Ohmi et al.

[11] Patent Number: 5,277,835

[45] Date of Patent: Jan. 11, 1994

[54] SURFACE TREATMENT AGENT FOR FINE SURFACE TREATMENT

[75] Inventors: Tadahiro Ohmi, Sendai; Masahiro Miki, Osaka; Hirohisa Kikuyama, Nara, all of Japan

[73] Assignee: Hashimoto Chemical Industries Co., Ltd., Sakai, Japan

[21] Appl. No.: 50,737

[22] Filed: Apr. 21, 1993

Related U.S. Application Data

[63] Continuation of Ser. No. 924,574, Aug. 5, 1992, abandoned, which is a continuation of Ser. No. 541,871, Jun. 21, 1990, abandoned.

[30] Foreign Application Priority Data

Jun. 26, 1989 [JP] Japan .................................. 1-163230
Sep. 21, 1989 [JP] Japan .................................. 1-246860

[51] Int. Cl.$^5$ .................................................. B05D 1/00
[52] U.S. Cl. ..................................... 252/79.3; 252/79.4
[58] Field of Search ........................... 252/79.3, 79.4; 156/657, 662

[56] References Cited

U.S. PATENT DOCUMENTS

| | | | |
|---|---|---|---|
| 3,650,960 | 3/1972 | Strauss et al. | 252/79.3 |
| 3,671,437 | 6/1972 | Pless | 252/79.3 |
| 3,920,471 | 11/1975 | Jones et al. | 252/79.3 X |
| 3,966,473 | 6/1976 | Sato | 252/79.3 X |
| 4,040,897 | 8/1977 | Blish et al. | 252/79.3 X |
| 4,125,427 | 11/1978 | Chen et al. | 252/79.3 X |
| 4,198,262 | 4/1980 | Gay | 252/79.3 X |
| 4,517,106 | 5/1985 | Hopkins et al. | 252/79.3 X |
| 4,795,582 | 1/1989 | Ohmi et al. | 252/79.3 |
| 4,921,572 | 5/1990 | Roche | 252/79.3 X |

*Primary Examiner*—Arthur L. Corbin
*Attorney, Agent, or Firm*—Armstrong, Westerman, Hattori, McLeland & Naughton

[57] ABSTRACT

A surface treatment agent containing a solution of hydrogen fluoride, ammonium fluoride and water, the solution containing less than 8 weight % of hydrogen fluoride (HF) and less than 15 weight % of ammonium fluoride ($NH_4F$).

2 Claims, 11 Drawing Sheets

SURFACE TREATMENT AGENT FOR FINE SURFACE TREATMENT

This application is a continuation of application Ser. No. 07/924,574 filed Aug. 5, 1992, now abandoned, which was a continuation of application Ser. No. 07/541,871, filed Jun. 21, 1990 and now abandoned.

BACKGROUND OF THE INVENTION

1. Field of the Invention

The present invention relates to a surface treatment agent for fine surface treatment and, more particularly, to a surface treatment agent for use in fine surface treatment which is very effective for wet etching of silicon oxide film in the manufacturing process of semiconductor devices, as well as cleaning of fine-treated semiconductor devices.

2. Description of Prior Art

Recently, there has been an increasing demand for cleanness, precision and high technology in the steps of cleaning, etching and patterning of wafer surfaces and fine treatment surfaces in wet process of semiconductor integrated circuits under the progress of high integration. So-called buffered hydrogen fluoride such as hydrofluoric acid, mixed solution of hydrogen fluoride and ammonium fluoride have been used for cleaning, etching and patterning as a surface treatment agent for fine surface treatment, and to meet the requirement for submicron ultra high integration, higher performance and function of the buffered hydrogen fluoride has been increasingly demanded.

Buffered hydrogen fluoride is usually prepared by mixing 40% ammonium fluoride and 50% fluoric acid in various mixing ratios, and is applied to the step of etching while controlling etching speed of silicon oxide film from 90 Å/min to 1200 Å/min in the range of 100:1 to 6:1, for example. In this case, the chemical composition of the buffered hydrogen fluoride is about 35 to 40% ammonium fluoride and about 0.5 to 7% hydrogen fluoride. It is generally considered that ammonium fluoride is necessary for adjustment of etching speed and as a buffer.

Several methods for improving wettability of such buffered hydrogen fluoride with respect to surface material of wafer have been recently proposed. For example, U.S. Pat. No. 3,650,960 and Japanese Laid-Open Patent Publication (unexamined) No. 63-283028 proposed improvement in uniformity and adhesion of particles in fine etching process by providing wettability by mixing aliphatic carboxylic acid, salt of aliphatic carboxylic acid, aliphatic amine and aliphatic alcohol. In this buffered hydrogen fluoride composition, however, a problem exists in that crystallization may take place during the storage in winter season due to a high concentration of ammonium fluoride. Thus, to overcome such a problem, the foregoing U.S. Pat. No. 3,650,960 and Japanese Laid-Open Patent Publication (unexamined) No. 63-283028 propose also the employment of other compositions having a reduced concentration of ammonium fluoride.

When looking into etching function of buffered hydrogen fluoride acid in detail from the viewpoint of ion chemical reaction mechanism, it is found that the chemical composition employed hitherto is not appropriate from stoichiometric point of view and, moreover, that there is an essential defect of impeding the progress of normal etching reaction therein. Problems in terms of prior chemical compositions can be summarized as follows:

(1) To produce $HF_2^-$ ion which is required for etching of $SiO_2$ film, HF needs equimolar $NH_4F$, and concentration of $NH_4F$ exceeding the same makes no contribution to etching reaction.

Accordingly, increase in mixing ratio of 40% ammonium fluoride to 50% hydrogen fluoride to achieve low etching ratio will bring about increase in unnecessarily excessive concentration of $NH_4F$.

(2) As a result of measuring solubility of ammonium hexafluoro silicate $(NH_4)_2SiF_6$ which is produced by reaction between $SiO_2$ film and $HF_2^-$ ion and soluble in buffered hydrogen fluoride solution with respect to various buffered hydrogen fluoride, it was recognized that solubility of this product is reduced significantly due to increase in concentration of $NH_4F$.

Accordingly, it may be said that unnecessarily excessive concentration of $NH_4F$ brings about considerable problems in the aspects of time linearity in fine pattern etching reaction and uniformity in patterning.

(3) Wettability of buffered hydrogen fluoride can be improved by mixing aliphatic hydrocarbon surfactant. There is, however, a limited narrow optimum range in the relation between concentration of surfactant and function thereof. It is an important factor to control the concentration.

When the concentration of $NH_4F$ is higher, the mentioned optimum range is narrower.

It has been also expected that cleaning function of diluted hydrogen fluoride, when applied to wafer surface or other surface to be finely treated as a cleaner, is considerably improved by giving wettability to the diluted hydrogen fluoride. At present, however, no surfactant satisfying required cleanness, stability and performance has been developed.

Cleaning using diluted fluoric acid is one of the important processes, and in which smoothness of cleaned surface is a very important factor in submicron devices. There remains some dry spots on a silicon wafer surface etched with buffered hydrogen fluoride. It is said that the dry spots can be normalized by mixing a suitable surfactant, as is proposed by Japanese Laid-Open Patent Publication No. 63-283028. However, as a result of analyzing a silicon wafer cleaned with diluted hydrogen fluoride, it was found that smoothness of the cleaned surface was damaged. This kind of damage results in grave problem, for example, in the formation of shallow junction. Accordingly, it seems essential to develop means for achieving smoothness on the surface by providing wettability even in the cleaning step with diluted hydrogen fluoride.

SUMMARY OF THE INVENTION

An object of the present invention is, therefore, to provide a chemical composition of buffered hydrogen fluoride to be used as etching agent so that essential mechanism of chemical reaction of etching take place normally, that chemical protection of photoresist is secured, and that performance range for giving wettability is enlarged.

Another object of the invention is to improve performance of diluted hydrogen fluoride to be used as cleaning agent by giving wettability thereto so that smoothness on cleaned surface is achieved.

As a result of research and development, it has been found by the inventors that uniformity and completeness of submicron pattern etching can be achieved by reducing NH4F concentration of buffered hydrogen fluoride to less than 15% and preparing HF concentration to be in the range of less than 8% thus maintaining etching speed of SiO2 film up to 1500 Å/min and resist protectability. It has been also found by the inventors that, in the mentioned NH4F concentration, the mixing range of hydrocarbon surfactant is enlarged thereby increasing applicable number of carbon, and that performance range of the surfactant is also enlarged thereby cleanness on the etching surface being improved. It has been further recognized by the inventors that hydrocarbon surfactant exhibits wettability by mixing a certain amount of ammonium fluoride with diluted hydrogen fluoride, and that smoothness on cleaned surface is achieved by utilizing such wettability, thus coming to make this invention.

The surface treatment agent in accordance with the present invention comprises any of the following:

(1) A surface treatment agent comprising a mixed solution of fluoric acid, ammonium fluoride and water, the mixed solution containing less than 0.01 to 8 weight % of hydrogen fluoride (HF) and less than 0.01 to 15 weight % of ammonium fluoride (NH4F).

(2) A surface treatment agent an aqueous solution containing less than 0.01 to 8 weight % of hydrogen fluoride and less than 0.01 to 15 weight % of ammonium fluoride, said aqueous solution further containing at least one of surfactants each comprising aliphatic carboxylic acid, salt thereof, aliphatic amine, and aliphatic alcohol.

(3) A surface treatment agent comprising an aqueous solution containing less than 0.01 to 8 weight % of hydrogen fluoride and less than 0.01 to 15 weight % of ammonium fluoride, said aqueous solution further containing aliphatic amine and at least one of surfactants each comprising aliphatic carboxylic acid, salt thereof, and aliphatic alcohol.

(4) A surface treatment agent as set forth in (1) above, said surface treatment agent being an etching agent for silicon oxide film.

(5) A surface treatment agent as set forth in (2) above, said surface treatment agent being an etching agent for silicon oxide film.

(6) A surface treatment agent as set forth in (3) above, said surface treatment agent being an etching agent for silicon oxide film.

(7) A surface treatment agent as set forth in (1) above, said surface treatment agent being a cleaning agent for silicon surface and semiconductor device surface.

(8) A surface treatment agent as set forth in (2) above, said surface treatment agent being a cleaning agent for silicon surface and semiconductor device surface.

(9) A surface treatment agent as set forth in (3) above, said surface treatment agent being a cleaning agent for silicon surface and semiconductor device surface.

In the low concentration area of ammonium fluoride according to the invention, performance of surfactant is exhibited more sufficiently. On the other hand, in the high concentration area of ammonium fluoride, performance of surfactant is exhibited only when carbon number of surfactant is not more than 12. As a result of tests on effective area by mixing surfactant with buffered hydrogen fluoride of low ammonium fluoride concentration, it was recognized that surfactant of larger carbon number also exhibited its performance if concentration of ammonium fluoride was in the range of less than 15%. In other words, wettability was desirably controlled by preparing an ammonium fluoride whose concentration was less than 15%.

Aliphatic amines improve wettability by lowering the contact angle of the treatment agent. The foaming tendency of aliphatic amines, however, is large and such amines will exert an undesirable influence on the manufacturing process of semiconductor if they are added alone. To minimize such foaming force, it is useful to add an aliphatic carboxylic acid or aliphatic alcohol both having defoaming capability, and thus provide a treatment agent of small foaming force and satisfiable performance. Though both aliphatic carboxylic acid and aliphatic alcohol exhibited defoaming capability in the high ammonium fluoride concentration area, it was recognized that they provide not only defoaming capability but also an improvement in wettability in the low ammonium fluoride concentration area of less than 15%.

Aliphatic amine being one of the surfactants used in the invention are a compound expressed by the chemical formula $C_mH_{2m+1}NH_2$ (where: n indicates an integer not larger than 25) and secondary or tertiary amine as shown below, for example:

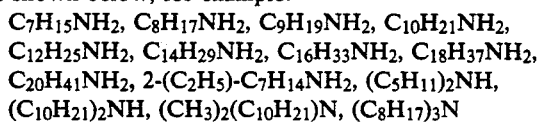

Aliphatic carboxylic acid is a compound expressed by the chemical formula $C_nH_{2n+1}COOH$ (where: n indicates an integer not larger than 25) as shown below, for example:

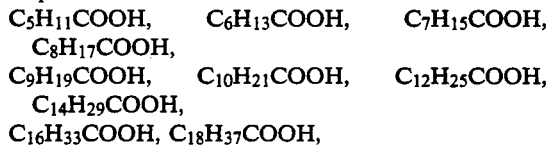

Aliphatic carboxylic acid salt is a compound expressed by the chemical formula $C_nH_{2n+1}COONH_3R$ (where: R indicates hydrogen atom or alkyl group and n indicates an integer not larger than 25) as shown below, for example:

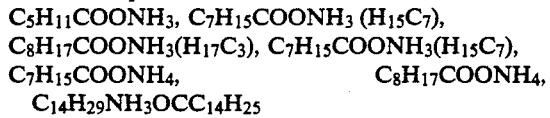

Aliphatic alcohol is a compound expressed by the chemical formula $C_nH_{2n+1}OH$ (where: n indicates an integer not larger than 25) as shown below, for example:

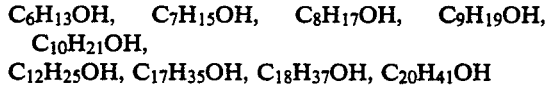

The mentioned surfactants are used singly or by mixing two or more in the form of solid or liquid. The amount of addition is in the range of 10 to 10000 ppm with respect to the entire composition, preferably in the range of 50 to 1000 ppm. If the amount of addition is less than 10 ppm, effect of addition is hardly exhibited. On the other hand, if it is more than 10000 ppm, no effect corresponding to the additional amount is achieved.

It was acknowledged that sufficient buffering was achieved by the treatment agent according to the invention.

DESCRIPTION OF PREFERRED EMBODIMENTS

Described hereinafter are results of experiments carried out by the inventors and which serve to further illustrate the invention.

1. Etching rate of SiO$_2$ film and composition of BHF:

To produce SiF$_6^{-2}$ by dissolving SiO$_2$, presence of ion is essential. Reaction of dissolving SiO$_2$ using HF solution proceeds through the following dissociation expressions (1), (2) and (3), and dissolving speed depends exclusively upon equilibrium constant of the dissociation expressions (1) and (2):

$$HF + H_2O = H_3O^+ + F^- \quad (1)$$

$$HF + H_3O^+ + F^- = H_3O^+ + HF_2^- \quad (2)$$

$$SiO_2 + 4HF_2^- = SiF_6^{2-} + 2F^- + 2H_2O \quad (3)$$

Reaction of dissolving SiO using HF solution proceeds through the following dissociation expression (4), and dissolving rate depends exclusively upon equilibrium constant of the dissociation expression (4):

$$NH_4HF_2 = NH_4^+ + HF_2^- \quad (4)$$

According to stoichiometric ratio, 8 moles of HF and 4 moles of NH$_4$HF$_2$ are equivalent with respect to 1 mole of SiO$_2$. Because degree of dissociation of expressions (1) and (2) is smaller than that of expression (4), it is obvious from etching rates of liquid compositions ① and ② shown in the following Table 1 that HF requires a very high concentration as compared with NH$_4$HF$_2$.

TABLE 1

| Liquid Comp. | BHF composition and SiO$_2$ film etching rate | | | | | |
|---|---|---|---|---|---|---|
| | NH$_4$HF$_2$:HF:NH$_4$F | | | (NH$_4$F:HF) | | Etching rate |
| | Mol/l | Mol/l | Mol/l | % | % | Å/min (25° C.) |
| ① | — | 5 | — | (0.0:10.0) | | 800 |
| ② | 2 | — | — | (7.4:4.0) | | 800 |
| ③ | 2 | — | 8 | (37.0:4.0) | | 650 |

In this way, it is a matter of course that using so-called buffered hydrogen fluoride mixed with NH$_4$F is more effective than using HF alone. However, it has never been recognized that addition of NH$_4$F to HF exceeding the equivalent makes no contribution to dissolving reaction. It is to be noted that etching rate is lowered in the composition ③ excessively mixed with NH$_4$F as compared with the composition ② because of dissociative retardation in the expression (4) due to increase in NH$_4$F concentration, in spite of the same HF concentration.

FIG. 1 shows such a relationship as mentioned above between the etching rate of SiO$_2$ film and BHF composition, and in which A, B, C and D respectively indicate following:
A: 500 Å/min
B: 1000 Å/min
C: 1200 Å/min
D: NH$_4$HF$_2$ Table 2 shows etching rates obtained by fixing HF concentration to 4% while changing NH$_4$F concentration.

TABLE 2

| NH$_4$F concentration (%) | HF concentration (%) | Etching rate |
|---|---|---|
| 35 | 4 | 670 |
| 30 | 4 | 721 |
| 25 | 4 | 761 |
| 20 | 4 | 741 |
| 15 | 4 | 784 |
| 10 | 4 | 790 |
| 5 | 4 | 722 |
| 3 | 4 | 475 |

In the same manner, etching rates were obtained respectively on 0.5 wt %, 1 wt %, 2 wt %, 6 wt % and 8 wt % HF concentrations. As a result of this, it was found that BHF composition for obtaining usually required etching rate of 90 to 1500 Å/min can be satisfiably achieved when NH$_4$F concentration is not more than 15%, and therefore it may be said that concentration of 30 to 40% mainly adopted at present in the art is quite unnecessary from the viewpoint of etching rate.

2. Solubility of (NH$_4$)$_2$SiF$_6$ and concentration of NH$_4$F:

FIG. 2 shows results of measurements of solubility of (NH$_4$)$_2$SiF$_6$ in solutions of various BHF compositions. It is understood from FIG. 2 that solubility of (NH$_4$)$_2$SiF$_6$ reduces significantly in accordance with reduction of NH$_4$F concentration. In FIG. 2 symbols E, F, G and H indicate respectively in order HF=0%, HF=0.5%, HF=2.4% and HF=6.0%.

3. Influence of saturation of (NH$_4$)$_2$SiF$_6$ in pattern etching of SiO$_2$ film:

When increasing concentration of (NH$_4$)$_2$SiF$_6$ in BHF by the etching of SiO$_2$ film thereby reaching saturated concentration, etching operation is stopped by crystallization of (NH$_4$)$_2$SiF$_6$. Simulation of (NH$_4$)$_2$SiF$_6$ saturation range at etching point can be performed by utilizing solubility data of (NH$_4$)$_2$SiF$_6$. Since it was very difficult to idealize variation in "SiF$_6^{2-}$ ion diffusion speed/SiO$_2$ etching speed" in accordance with conditions such as concentration, temperature and variation in liquid composition due to reaction, in the actual simulation, model was established in such a manner that liquid phase portion, wherein SiF$_6^{2-}$ ion produced by reaction reached saturated concentration of BHF at the initial composition thereof, was semi-spherically expanded from etching point, and necessary calculation was made on such model. FIG. 3 shows the simulation. Referring to FIG. 3, for carrying out etching with a depth of 1 μm on contact holes whose size is 10 μm and 0.5 μm respectively, if solubility of (NH$_4$)$_2$SiF$_6$ is different in the ratio of 1:5, saturation area of (NH$_4$)$_2$SiF$_6$ of BHF solution is also different in a ratio of 1:5, and accordingly it is obvious that BHF of higher NH$_4$F concentration is more influenced by precipitation of saturated (NH$_4$)$_2$SiF$_6$. There are several points to be noted in this respect.

The first point to be noted relates to size of contact hole. Saturation area of (NH$_4$)$_2$SiF$_6$ becomes larger when hole size is larger, i.e., in proportion to a square of hole size. Table 2 shows a relationship between hole size and unevenness in etching. It is understood from the table that the degree of incomplete etching is considerably higher in a 10 μm hole as compared with a hole not more than 1 μm, which clearly shows influence by saturation of (NH$_4$)$_2$SiF$_6$.

The second point to be noted relates to the aspect ratio of a hole. As shown in FIG. 3, with respect to the same saturated area, aspect ratio of a hole being able to be etched is in inverse proportion to solubility of $(NH_4)_2SiF_6$.

This influence becomes more significant when hole size is smaller. Thus, as shown in FIG. 3, aspect ratio of etching with BHF of high $NH_4F$ concentration is restricted to be small in submicron etching.

As a result of the mentioned simulation and etching data, it was made clear by the inventors how excessive concentration of $NH_4F$ gave undesirable influence to etching. FIGS. 3(A) and (B) show respectively the following compositions:

| (A) $NH_4F$ | 38.1% |
|---|---|
| HF | 2.4% |
| SpGr | 1.114 |

Solubility of $(NH_4)_2SiF_6$:1.9/100 g BHF(20° C.);

| (B) $NH_4F$ | 15.1% |
|---|---|
| HF | 2.4% |
| SpGr | 1.114 |

Solubility of $(NH_4)_2SiF_6$:9.4/100 g BHF(20° C.).

The third point to be noted is the influence of saturation of $(NH_4)_2SiF_6$ on durability of etching rate. As shown in FIG. 4, since solubility of $(NH_4)_2SiF_6$ is small in BHF of high $NH_4F$ concentration, slow down in etching rate comes sooner. In this respect, FIG. 4 shows an etching amount of square hole of 10 $\mu$m in 2.4% of HF measured at 25° C., and in which symbols A and B indicate the following respectively:

A:$NH_4F$ is 38.1%
B:$NH_4F$ is 15.0%

It is understood from the data mentioned in 1 to 3 that, in the cleaning and fine pattern etching of silicon oxide film using an etching agent comprising hydrogen fluoride and ammonium fluoride, the conventionally employed ammonium fluoride concentration of 15 to 40%, more popularly 30 to 40%, brings about not only slow down in etching rate but also reduction in solubility of ammonium hexafluoro silicate, which results in grave problems of increased uneven etching and undesirable aspect ratio of etching. It is also understood from the mentioned expressions (1) to (4) that a suitable concentration of $NH_4F$ necessary for obtaining the etching rate of 800 to 1500 Å/min at 25° C. to etch thermal oxide film is not more than 15%, preferably not more than 10%.

4. Functional area of surfactant and concentration of $NH_4F$:

Wettability on the wafer surface can be improved by mixing buffered hydrogen fluoride with hydrocarbon surfactant thereby reducing contact angle, and further fine particles in buffered hydrogen fluoride can be filtered to be clean in the specific concentration area of surfactant. This specific concentration area of surfactant is herein called area of functional concentration. FIG. 5 shows clearly that such area of functional concentration depends upon concentration of $NH_4F$ in buffered hydrogen fluoride acid.

It is certain that contact angle is lowered according to addition of surfactant, but on and from a certain concentration the contact angle is constant. This concentration point is called "critical micell concentration (CMC)". If concentration of $NH_4F$ is high, the curve coming to CMC point is sharp, and width of area of functional concentration of surfactant having small number of particles is small. If adding surfactant slightly exceeding such width or control range, stain due to micell may be found at the time of etching of silicon oxide film. On the other hand, if concentration of $NH_4F$ is less than 15%, curve coming to CMC point is gentle, and width of are of functional concentration of surfactant having small number of particles is large. At the time of etching silicon oxide film, no generation of stain was found. As a result of this, since the area of functional concentration of surfactant is enlarged in buffered hydrogen fluoride whose $NH_4F$ concentration is less than 15%, it may be said that buffered hydrogen fluoride excellent in wettability and cleanness can be adjusted within sufficiently wide control range. In FIG. 5(A), (B) and (C), marks ◯ and ● show followings respectively. In addition, symbols A indicates contact angle and B indicates number of particles.

(A)
Mark ◯ indicates HF: 5.4% and $NH_4F$: 15.0%;
Mark ● indicates HF: 5.4% and $NH_4F$: 30.0%;
(B)
Mark ◯ indicates HF: 2.4% and $NH_4F$: 15.0%;
Mark ● indicates HF: 2.4% and $NH_4F$: 38.1%;
(C)
Mark ◯ indicates HF: 0.5% and $NH_4F$: 15.0%; and
Mark ● indicates HF: 0.5% and $NH_4F$: 39.6%.

5. Crystallization temperature

In high $NH_4F$ concentration area, crystallization of $NH_4HF_2$ may occur in buffered hydrogen fluoride. This crystallization may cause variation in etching speed, i.e., trouble in the process of wet etching. In this respect, it was recognized by the inventors that there existed two relative curves in the crystallization according to change in concentration of $NH_4F$. One is a freezing point depression curve, and another is a crystallization curve. In low $NH_4F$ concentration area, freezing point goes lower according to increase of $NH_4F$. Solid phase crystallized in this area is ice. The lowest point comes at about 15%, and over this point is transferred to crystallization area and crystallization temperature is increased. Solid phase crystallized in this area is $NH_4HF_2$. FIG. 6 shows a result of such situation. It is understood from FIG. 6 that crystallization of $NH_4HF_2$ can be restricted to a great extent by reducing the $NH_4F$ concentration to less than 15%. Furthermore, even when icing takes place, there is no influence on etching rate because the ice melts easily by increasing temperature. In FIG. 6, the marks indicate followings respectively:

—●—: 4% HF
—◐—: 6% HF
—◯—: 8% HF

6. Smoothness on the cleaned surface:

For cleaning silicon surface or fine treated semiconductor device surface, a diluted solution of fluoric acid has been generally employed. Such cleaning with hydrogen fluoride, however, has a drawbacks of occurring dry spot on the cleaned surface. In order to prevent generation of such dry spot, addition of surfactant is required. Actually, there has been no suitable surfactant capable of giving wettability and reduction of particles to diluted hydrogen fluoride. In this respect, it was found by the inventors that when adding a little amount of NH F to diluted hydrogen fluoride, then it was possible to exhibit the mentioned wettability and other performances by addition of surfactant. It was, thus, recognized that not only wettability was improved but also cleaned surface was prevented from occurrence of dry spot. Table 14 shows a result of such situation. Formation of shallow junction is easy by making the cleaned surface smooth.

Employment of surfactant is preferable in view of improvement is cleaning, and in particular it is preferable for surfactant to be used together with at least one of aliphatic amine, aliphatic carboxylic acid or aliphatic alcohol.

7. Capability of selective etching:

The rate of etching PSG film, BPSG film and thermal oxide film can be varied by reducing the concentration of ammonium fluoride. FIGS. 8 to 10 are diagrams each showing a result of etching rate measured on various oxide films.

When using a buffered hydrogen fluoride of 5.0% hydrogen fluoride and 4.6% ammonium fluoride, etching rate of thermal oxide film was 772 Å/min. On the other hand, etching rate of PSG film was 33700 Å/min, that of BPSG film (without heat treatment) was 6370 Å/min., and that of BPSG film (heat treated) was 2614 Å/min. This means that etching rates of these PSG and BPSG films were respectively 43.7 times, 8.25 times and 3.4 times as high as the etching rate of thermal oxide film. Accordingly, making use of these differences in etching rate, when etching some film wherein thermal oxide film and PSG film are coexistent, for example, the PSG film alone is etched while remaining not etched the thermal oxide film. In this manner, selective etching is accomplished.

As described so far, it is now achieved by the invention, as a result of reducing the concentration of ammonium fluoride, to increase solubility of ammonium hexafluoro silicate thereby eliminating poor performance in pattern etching being and to exhibit etching of high aspect ratio. Since concentration of ammonium fluoride is lower than the conventional buffered hydrogen fluoride, not only hydrocarbon surfactant of larger carbon number can be used but also such performance as wettability, cleanness can be satisfiably presented. Furthermore, range of addition amount is wider than ever, which results in easiness in control. Chemical action on resist is sufficiently easened according to the invention in spite of low concentration of ammonium fluoride. The invention is advantageous not only in cleaning of highly integrated semiconductor device, silicon wafer or fine processed surface, but also in smoothening of surface at the time of forming shallow junction, thus the conventional drawbacks being overcome.

EXAMPLES

Figure 1:
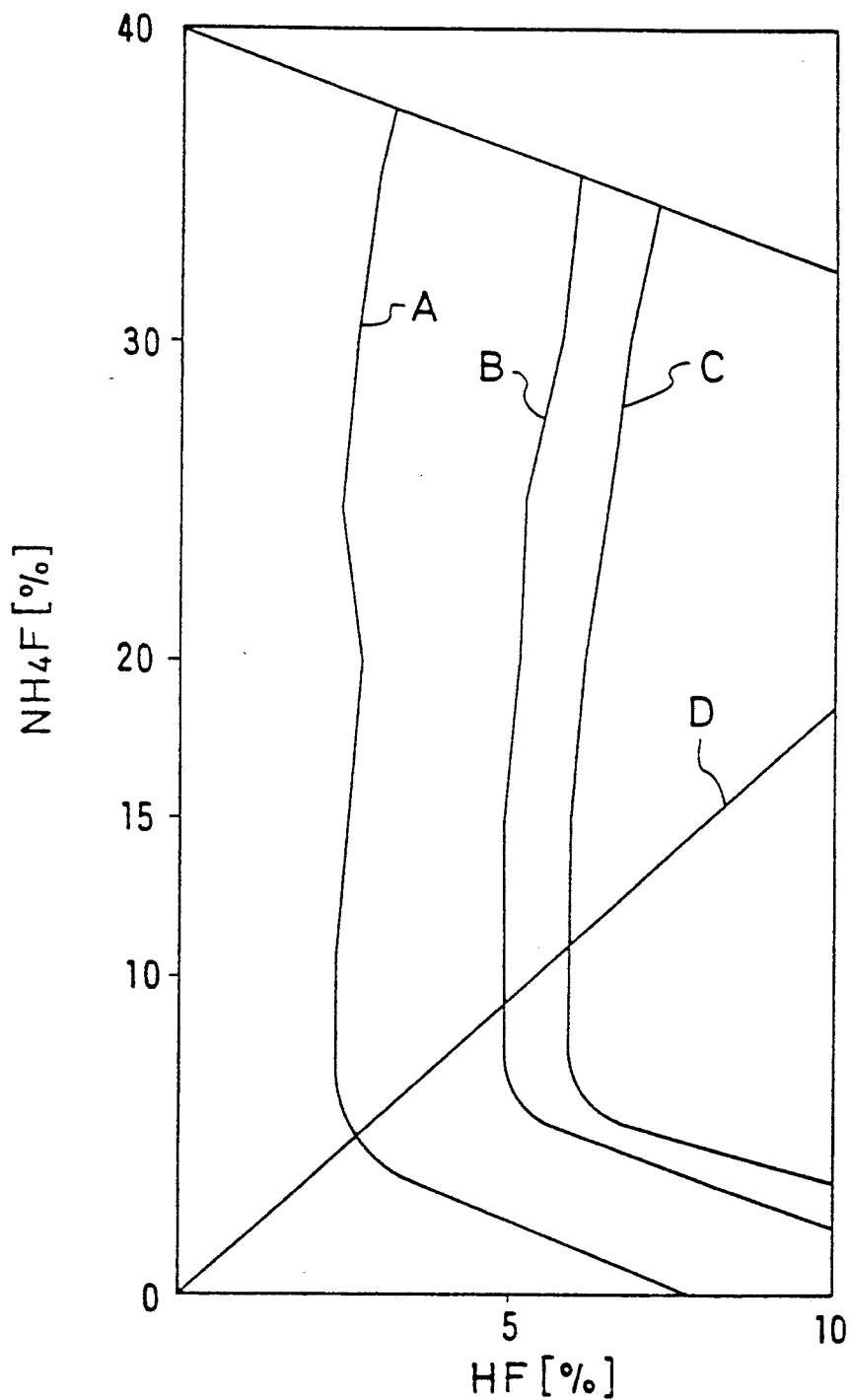
FIG. 1 is a graphic diagram showing a relationship between etching rate of $SiO_2$ film and composition of BHF at 25° C.
Figure 2:
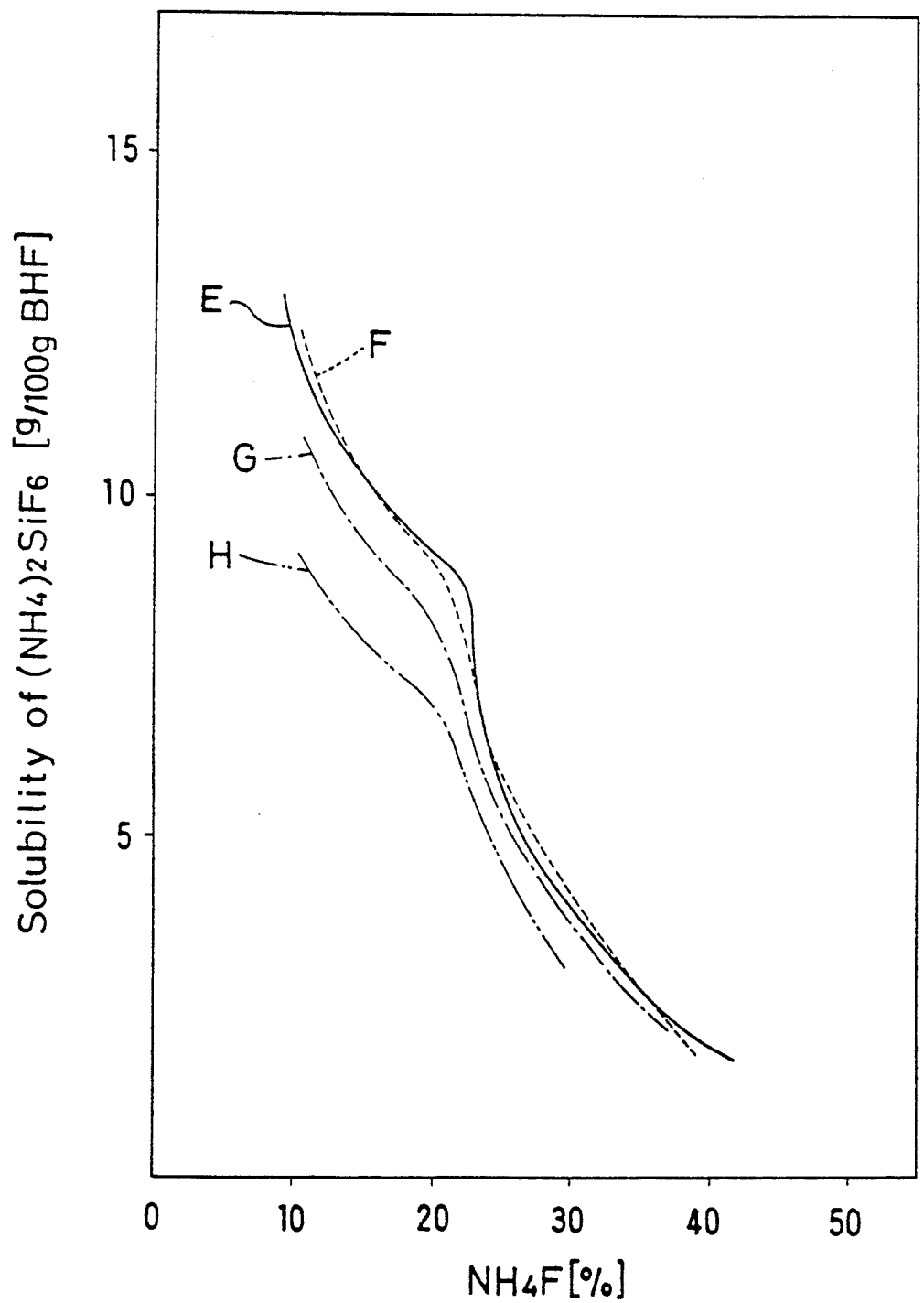
FIG. 2 is a graph showing solubility of $(NH_4)_2SiF_6$ in various BHF compositions at 25° C.
Figure 3A:
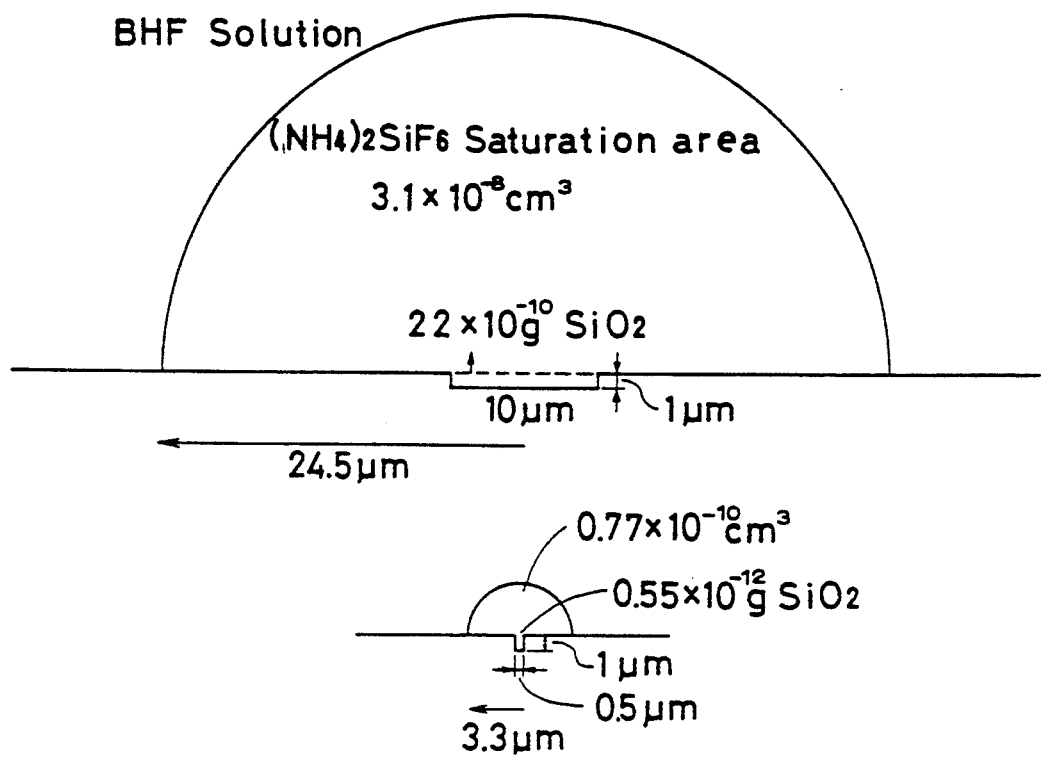
FIGS. 3(A) and (B) are diagrams each showing simulation ($SiO_2 + BHF \rightarrow (NH_4)_2SiF_6$) of saturation area of $(NH_4)_2SiF_6$ in BHF solution when etching contact holes.
Figure 3B:
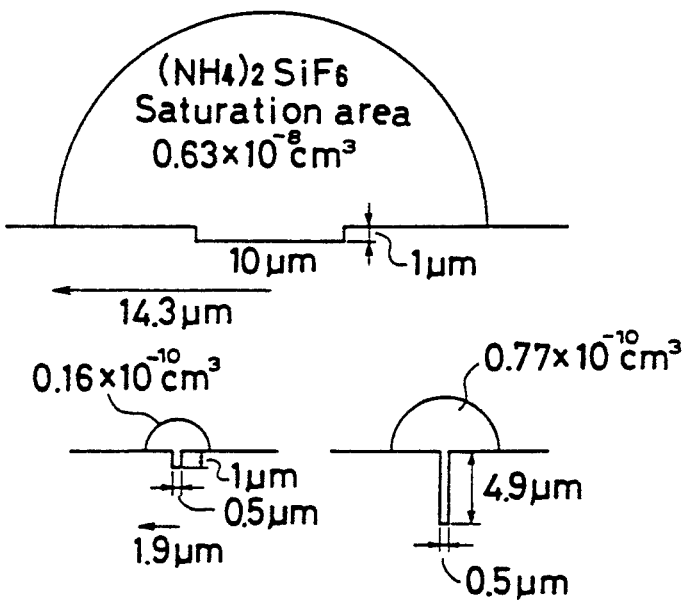

Described in detail hereinafter are examples of the invention.

Example 1

Contact holes each being 10 μm in diameter were etched with HF concentrations shown in Table 3 with the use of solutions each having 9.9% $NH_4F$ concentration. Percentage of defective contact holes was measured with an optical microscope. Table 3 shows the result.

TABLE 3

| $NH_4F$ Con. (%) | HF Con. (%) | Etching Depth (Å) | Defective hole (%) |
|---|---|---|---|
| 9.9 | 0.5 | 3000 | 0 |
| " | 0.5 | 5000 | 0 |
| " | 0.5 | 7000 | 0 |
| " | 2.4 | 3000 | 0 |
| " | 2.4 | 5000 | 0 |
| " | 2.4 | 7000 | 0 |
| " | 5.4 | 3000 | 0 |
| " | 5.4 | 5000 | 0 |
| " | 5.4 | 7000 | 0 |

Comparative Example 1

Using solutions each having composition shown in Table 4, the same treatment as the mentioned example 1 was carried out. Table 4 shows the result.

TABLE 4

| Composition of solution | | Etching | Defective |
|---|---|---|---|
| NH F Con. (%) | HF Con. (%) | Depth (Å) | hole (%) |
| 39.6 | 0.5 | 3000 | 99.6 |
| 39.6 | 0.5 | 5000 | 100 |
| 39.6 | 0.5 | 7000 | 100 |
| 39.6 | 2.4 | 3000 | 99.5 |
| 39.6 | 2.4 | 5000 | 100 |
| 39.6 | 2.4 | 7000 | 99.3 |
| 39.6 | 5.4 | 3000 | 96.9 |
| 39.6 | 5.4 | 5000 | 97.4 |
| 39.6 | 5.4 | 7000 | 96.5 |

Example 2

Various contact holes were etched with the use of solutions each having concentration shown in Table 5. Percentage of defective contact holes was measured with an optical microscope. Table 5 shows the result.

TABLE 5

| Composition of solution | | Contact hole | Defective |
|---|---|---|---|
| $NH_4F$ Con. (%) | HF Con. (%) | size (μm) | hole (%) |
| 9.9 | 0.5 | 10.0 | 0 |
| " | " | 1.0 | " |
| " | " | 0.9 | " |
| " | " | 0.8 | " |
| " | " | 0.9 | " |
| " | 2.4 | 10.0 | " |
| " | " | 1.0 | " |
| " | " | 0.9 | " |
| " | " | 0.8 | " |
| " | " | 0.7 | " |
| " | 5.4 | 10.0 | " |
| " | " | 1.0 | " |
| " | " | 0.9 | " |
| " | " | 0.8 | " |

TABLE 5-continued

| Composition of solution | | Contact hole | Defective |
|---|---|---|---|
| NH₄F Con. (%) | HF Con. (%) | size (μm) | hole (%) |
| " | " | 0.7 | " |

Comparative Example 2

Various contact holes were etched with the use of solutions each having concentration shown in Table 6. Percentage of defective contact holes was measured with an optical microscope. Table 6 shows the result.

TABLE 6

| Composition of solution | | Contact hole | Defective |
|---|---|---|---|
| NH₄F Con. (%) | HF Con. (%) | size (μm) | hole (%) |
| 39.6 | 0.5 | 10.0 | 99.6 |
| " | " | 1.0 | 91.5 |
| " | " | 0.9 | 91.0 |
| " | " | 0.8 | 86.6 |
| " | " | 0.9 | 68.9 |
| 38.1 | 2.4 | 10.0 | 99.5 |
| " | " | 1.0 | 74.2 |
| " | " | 0.9 | 61.0 |
| " | " | 0.8 | 43.8 |
| " | " | 0.7 | 38.0 |
| 30.0 | 5.4 | 10.0 | 96.9 |
| " | " | 1.0 | 71.1 |
| " | " | 0.9 | 59.8 |
| " | " | 0.8 | 45.3 |
| " | " | 0.7 | 40.1 |

Example 3

After etching contact holes of 0.7 μm for a certain time with the use of a solution composed of 0.5% HF concentration and 9.9% NH₄F concentration, etched depth section was measured by electronic microscope to obtain aspect ratio (opening width/depth). Table 7 shows the result

TABLE 7

| Composition of solution | | Etching | |
|---|---|---|---|
| NH₄F Con. (%) | HF Con. (%) | time (min) | Aspect ratio |
| 9.9 | 0.5 | 30 | 0.10 |
| " | " | 50 | 0.30 |
| " | " | 70 | 0.40 |

Comparative Example 3

Etching was carried out in the same manner and conditions as the mentioned Example 3 except that concentration of NH₄F was set to 39.6%. Table 8 shows the result.

TABLE 8

| Composition of solution | | Etching | |
|---|---|---|---|
| NH₄F Con. (%) | HF Con. (%) | time (min) | Aspect ratio |
| 39.6 | 0.5 | 30 | 0.10 |
| " | " | 50 | 0.30 |
| " | " | 70 | 0.40 |

Example 4

After etching contact holes of 10 μm with the use of a solution composed of 2.4% HF concentration and 9.9% NH₄F concentration, etched depth was measured by step gage. Table 9 shows the result.

TABLE 9

| Composition of solution | | Etching | Etched |
|---|---|---|---|
| NH₄F Con. (%) | HF Con. (%) | time (min) | amount (Å) |
| 9.9 | 2.4 | 6 | 3100 |
| " | " | 10 | 5100 |
| " | " | 14 | 7200 |

Figure 4:
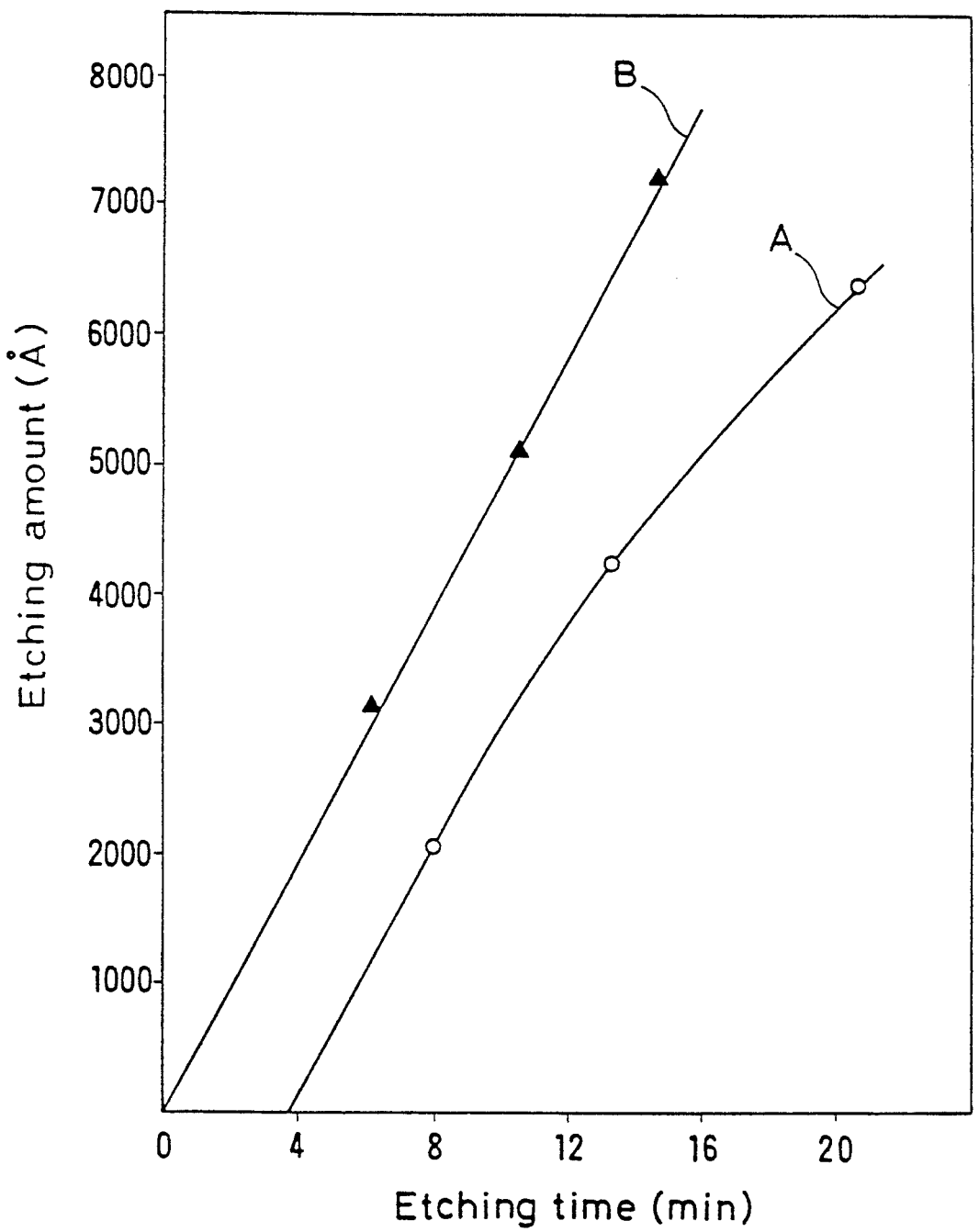
FIG. 4 is a graph showing retardation effect of etching rate due to production of $(NH_4)_2SiF_6$.
Figure 5A:
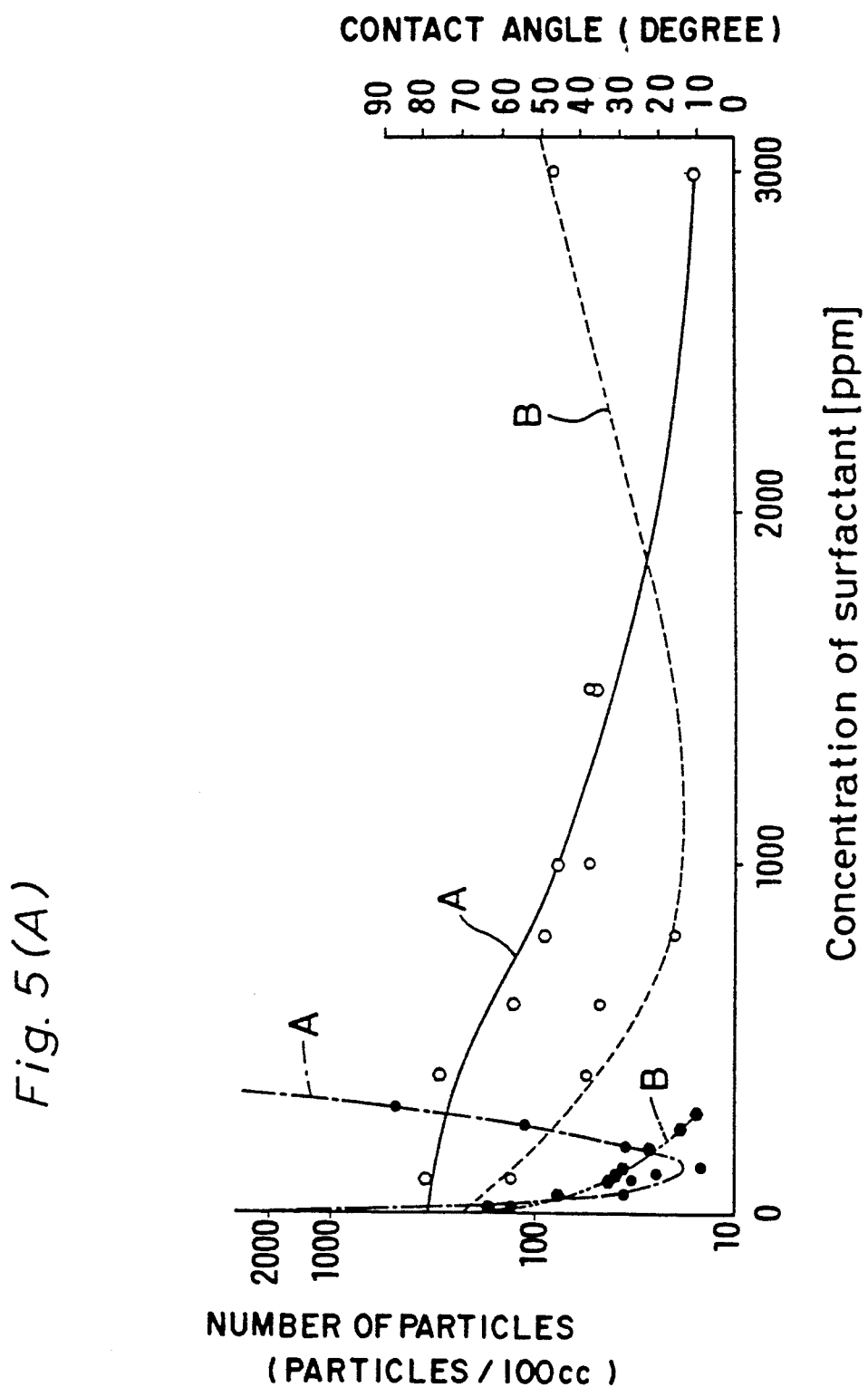
FIGS. 5(A) and (B) are graphs each showing area of functional concentration of surfactant.
Figure 5B:
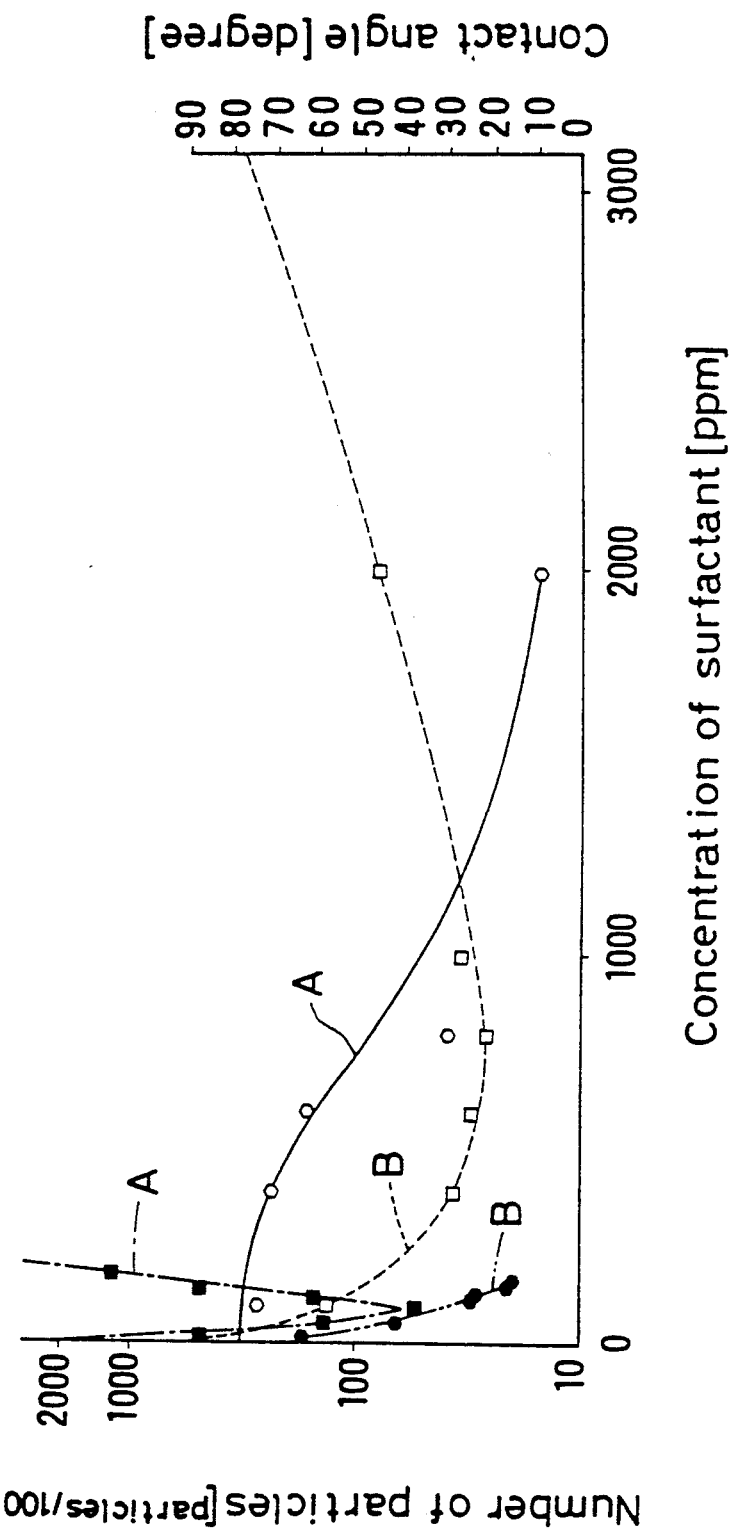
Figure 6:
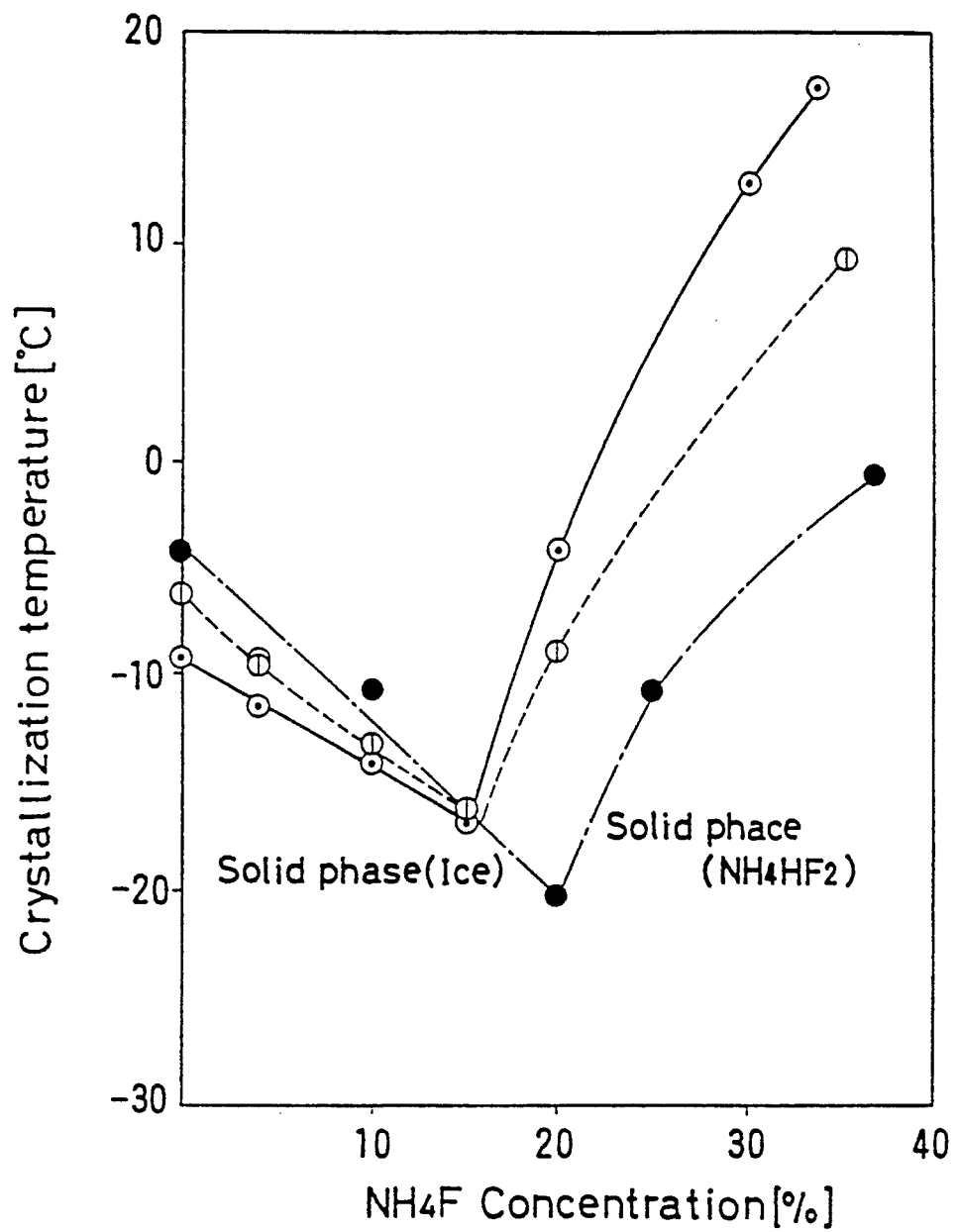
FIG. 6 is a graph showing crystallization concentration.

FIG. 4 also shows the result, and from which it is understood that the etching speed is shown in the form of a straight line passing through the origin, which means that etching speed is constant.

Comparative Example 4

Etching was carried out in the same manner and conditions as the mentioned Example 4 except that concentration of NH₄F was set to 38.1%. Table 10 shows the result.

TABLE 10

| Composition of solution | | Etching | Etched |
|---|---|---|---|
| NH₄F Con. (%) | HF Con. (%) | time (min) | amount (Å) |
| 38.1 | 2.4 | 8 | 2050 |
| " | " | 12.5 | 4250 |
| " | " | 18.0 | 6300 |

As shown in FIG. 4, etching speed curve does not pass through the origin. That is, the start of etching is delayed and the etching speed is reduced.

Example 5

Contact holes of 10 μm were etched with the use of a solution prepared by adding HF of concentration shown in Table 11 to 5% NH₄F concentration, then the result was measured by optical microscope. FIG. 11 shows the result.

TABLE 11

| Etched depth (Å) | Defective 10 μm contact hole (%) | | | |
|---|---|---|---|---|
| | NH₄F Con. (%) | HF Con. | | |
| | | 0.5% | 2.4% | 6.0% |
| 3000 | 5.0 | 0 | 0 | 0 |
| 5000 | " | 0 | 0 | 0 |
| 7000 | " | 0 | 0 | 0 |

Example 6

Contact holes of 10 μm and 1.0 μm were etched with the use of a solution prepared by adding a predetermined amount of surfactants shown in Table 12 to a solution of 9.9% NH₄F concentration and 0.5% HF concentration, then the percentage of defective contact holes was measured by optical microscope. FIG. 12 shows the result.

TABLE 12

| Surfactant | | Defective contact hole (%) | |
|---|---|---|---|
| Kind | Con. | 10 μm contact hole | 1 μm contact hole |
| $C_8H_{17}NH_2$ | 500 | 0 | 0 |
| $C_8H_{17}COOH$ | 200 | | |
| $C_{10}H_{21}NH_2$ | 140 | 0 | 0 |
| $C_{10}H_{21}OH$ | 80 | | |
| $C_{14}H_{29}NH_4$ | 100 | 0 | 0 |
| $C_{14}H_{29}COOH$ | 60 | | |
| $C_{18}H_{37}NH_2$ | 80 | 0 | 0 |

TABLE 12-continued

| Surfactant | | Defective contact hole (%) | |
|---|---|---|---|
| Kind | Con. | 10 μm contact hole | 1 μm contact hole |
| $C_{18}H_{37}OH$ | 40 | | |
| $C_{20}H_{41}NH_2$ | 60 | 0 | 0 |
| $C_7H_{15}COOH$ | 20 | | |
| $C_8H_{17}NH_2$ | 800 | 0 | 0 |
| $C_{10}H_{21}NH_2$ | 250 | 0 | |
| $C_{14}H_{29}NH_2$ | 200 | 0 | |
| $C_{18}H_{37}NH_2$ | 150 | 0 | |
| $C_{20}H_{41}NH_2$ | 100 | 0 | 0 |
| $(C_{10}H_{21})_2NH$ | 100 | 0 | 0 |

Example 7

$SiO_2$ on a silicon wafer was etched with the use of a solution prepared by adding 800 ppm of $C_{14}H_{29}NH_2$ and 400 ppm of $C_8H_{17}COOH$ to a solution containing 14% ammonium inspected by a microscope, no stain was found. Table 13 shows the result.

Comparative Example 5

$SiO_2$ on a silicon wafer was etched with the use of a solution prepared by adding 100 ppm of $C_{14}H_{29}NH_2$ and 60 ppm of $C_8H_{17}COOH$ to a solution containing 14% ammonium fluoride and 2.4% fluoric acid, then the silicon wafer was inspected by a microscope, stain was found. Table 13 shows the result.

TABLE 13

| Etching composition | Example 7 | Comparative example 5 |
|---|---|---|
| $NH_4F$ | 14.0% | 38.1% |
| HF | 2.4% | 2.4% |
| $C_{14}H_{29}NH_2$ | 800 ppm | 100 ppm |
| $C_8H_{17}COOH$ | 400 ppm | 60 ppm |
| Detected % of stain | 0% | 5 to 10% |

In this respect, occurrence of stain in the mentioned Example 7 and Comparative Example 5 means that SiO was not etched evenly but remains in the form of stain. As is obvious from Comparative Example 5, it is understood from the table that addition of surfactant results in occurrence of stain if content of ammonium fluoride is high and therefore it is impossible to add a large amount of surfactant. of surfactant.

It is further understood from the table that even when surfactant is used together, no desired result is achieved if concentration of ammonium fluoride is high. Example 8

As a result of cleaning a P-type silicon wafer processed by CZ method with the use of a solution containing 5% $NH_4F$, 1.7% HF, 80 ppm $C_{14}H_{27}NH_2$ and 40 ppm $C_8H_{17}COOH$ and inspecting the cleaned wafer by microscope, the surface of the cleaned wafer was found smooth. Table 14 shows the result.

Comparative Example 6

As a result of cleaning a P-type silicon wafer processed by CZ method with the use of 4.9% HF solution having the same etching speed as Example 8, dry spot was found on the surface. Table 14 shows the result.

TABLE 14

Figure 7A:
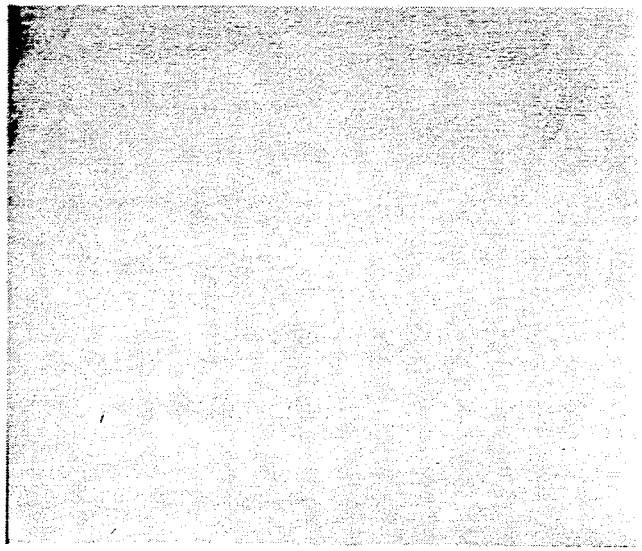
FIG. 7(A) and (B) are diagrams each showing a simulation of microphotographs of wafer surface.
Figure 7B:
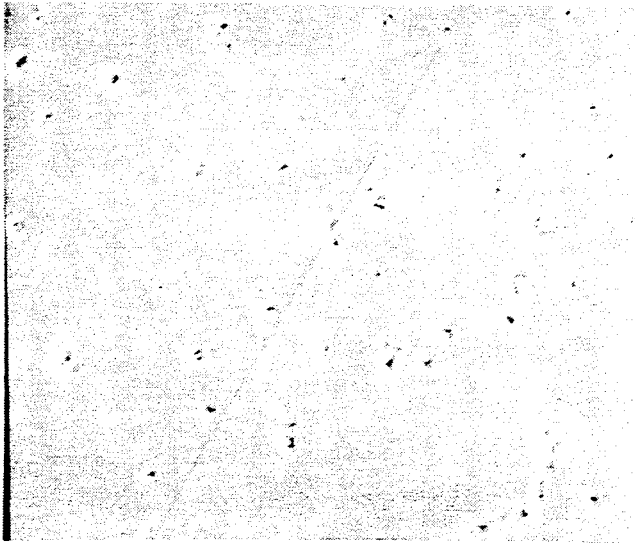
Figure 8:
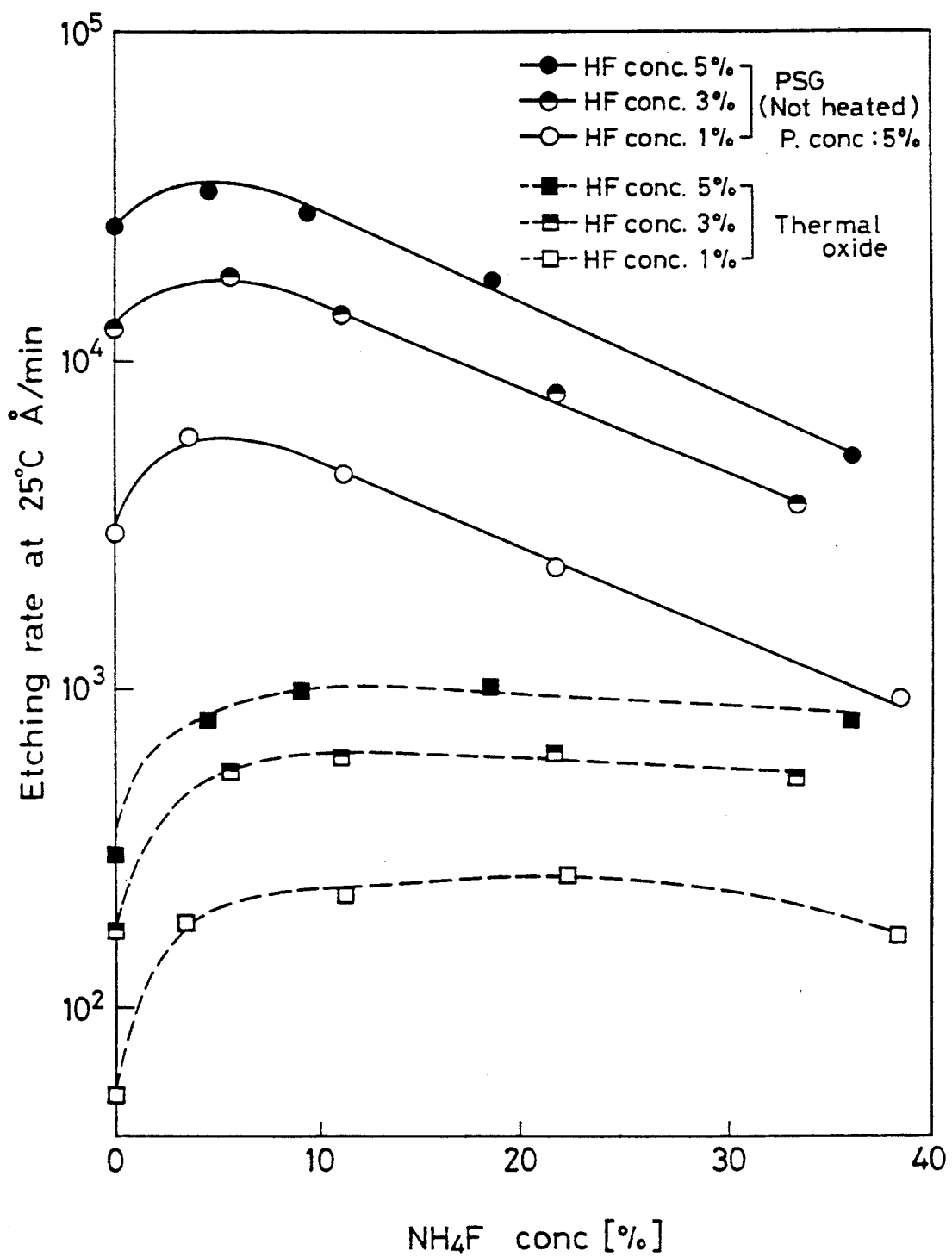
FIGS. 8 to 10 are diagrams each showing a result of etching rate measured on various oxide films.
Figure 9:
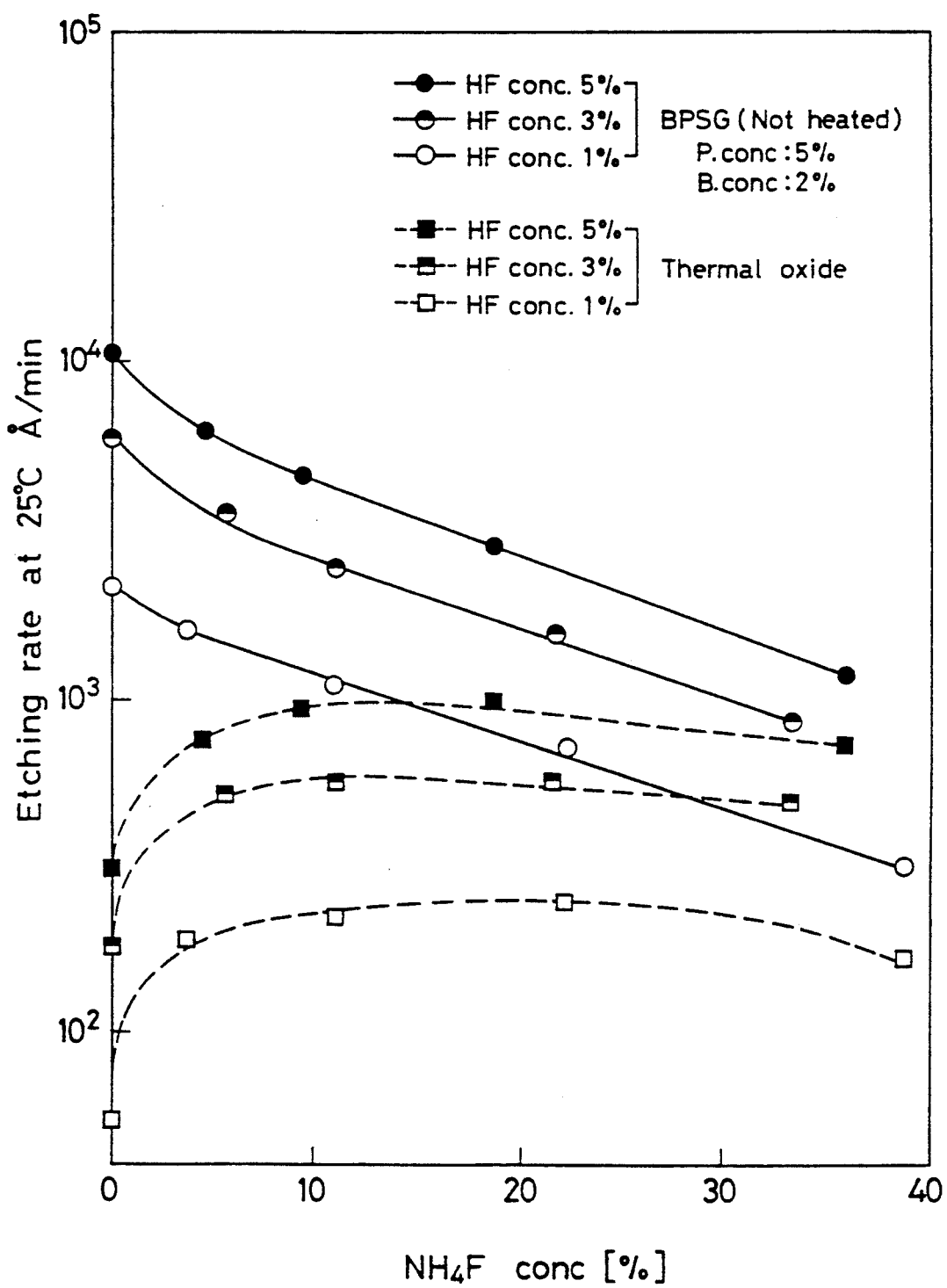
Figure 10:
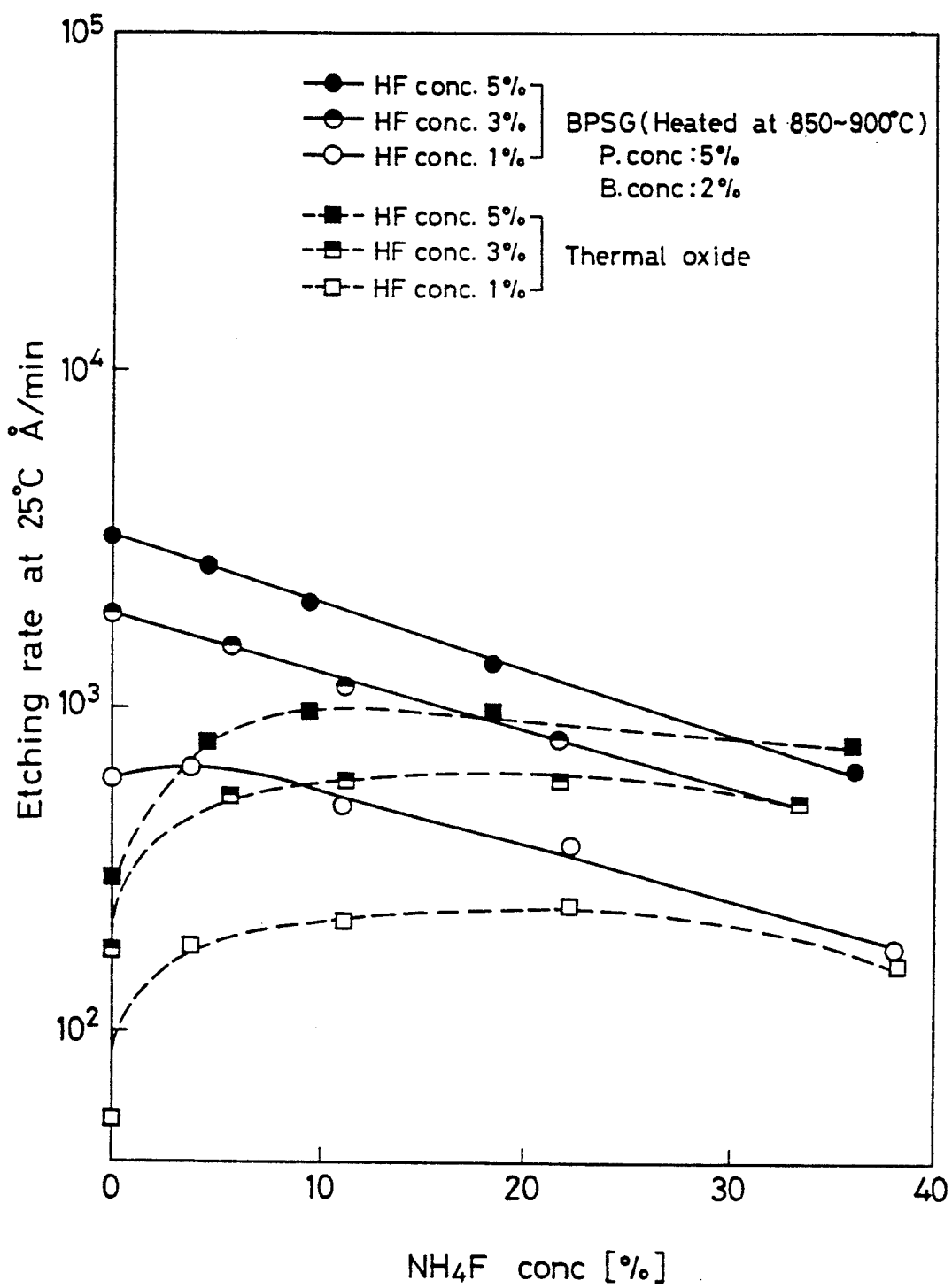

| | Example 8 | | Comparative example 6 |
|---|---|---|---|
| Composition of cleaning solution | $NH_4F$ | 5.0% | HF 4.9% |
| | HF | 1.7% | |
| | $C_{14}H_{27}NH_2$ | 80 ppm | |
| | $C_8H_{17}COOH$ | 40 ppm | 2.4% |
| Etching rate | 300 Å/min | | 300 Å/min |
| Contact angle | 32 degrees | | 79 degrees |
| Wafer surface | smooth | | found dry spot |
| Illustration simulated SEM photo | FIG. 7A | | FIG. 7B |

Example 9

Using the treatment agent according to the invention, a resist (OFPR-800) was applied to a silicon wafer to be 13000 Å in film thickness, then contact hole of 10 μm was provided for etching. As a result of microscope inspection, no abnormality was found on the resist. FIG. 15 shows the result.

TABLE 15

| Composition | | |
|---|---|---|
| $NH_4F$ | 10% | 14.5% |
| HF | 4.0% | 5.0% |
| $C_{12}H_{25}NH_2$ | 100 ppm | 150 ppm |
| $C_7H_{15}COOH$ | 80 ppm | 100 ppm |
| Etching rate | 800 Å/min | 1000 Å/min |
| Abnormality | not found | not found |

Example 10

A surfactant was added to an aqueous solution containing 10% $NH_4F$ and 1% HF, and foaming thereby was tested.

In the measurement, 10 ml of treatment agent was put in a plastic receptacle of 30 mm in internal diameter and 70 mm in height, then the receptacle was shaken for 10 seconds. Time spent from shaking to defoaming was counted. Table 16 shows the result.

TABLE 16

| RUN | Surfactant | Amount added (ppm) | defoaming time (min) | Contact angle(°) |
|---|---|---|---|---|
| 1 | $C_8H_{17}NH_2$ | 1500 | longer than 3 | 35 |
| 2 | $C_8H_{17}NH_2$ | 1000 | shorter than 1 | 36 |
| | $C_8H_{17}COOH$ | 300 | | |
| 3 | $C_8H_{17}NH$ | 1000 | shorter than 1 | 35 |
| | $C_8H_{17}OH$ | 300 | | |
| 4 | $C_{14}H_{29}NH_2$ | 200 | longer than 3 | 40 |
| 5 | $C_{14}H_{29}NH_2$ | 130 | shorter than 1 | 39 |
| | $C_{10}H_{21}COOH$ | 40 | | |
| 6 | $C_{14}H_{29}NH_2$ | 130 | shorter than 1 | 39 |
| | $C_{10}H_{21}OH$ | 40 | | |

What is claimed is:

1. A surface treatment agent comprising an aqueous solution containing 0.01 to 8 weight % of hydrogen fluoride, 0.01–10 weight % of ammonium fluoride, said aqueous solution further containing at least one member of the group consisting of aliphatic carboxylic acids, aliphatic carboxylic acid salts, aliphatic amines and aliphatic alcohols.

2. The surface treatment agent of claim 1, wherein said member is an aliphatic amine and at least one other member of said group.

* * * * *